(12) United States Patent
Lee et al.

(10) Patent No.: US 9,877,384 B2
(45) Date of Patent: Jan. 23, 2018

(54) DISPLAY DEVICE

(71) Applicant: SAMSUNG DISPLAY CO., LTD., Yongin-si, Gyeonggi-do (KR)

(72) Inventors: Jusuck Lee, Seoul (KR); Junghun Lee, Hwaseong-si (KR); Younjoon Kim, Seoul (KR); Mi Jang, Suwon-si (KR); Kyungmin Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/973,551

(22) Filed: Dec. 17, 2015

(65) Prior Publication Data

US 2016/0324014 A1 Nov. 3, 2016

(30) Foreign Application Priority Data

Apr. 30, 2015 (KR) .................... 10-2015-0061132

(51) Int. Cl.
*H05K 1/16* (2006.01)
*H05K 1/02* (2006.01)
*G06F 1/16* (2006.01)

(52) U.S. Cl.
CPC ........... *H05K 1/028* (2013.01); *G06F 1/1652* (2013.01); *H05K 2201/051* (2013.01); *H05K 2201/10128* (2013.01)

(58) Field of Classification Search
CPC ...... G06F 1/162; G06F 1/1622; G06F 1/1649; G06F 1/1626; G06F 1/1654; G06F 1/181; G06F 2200/1638; H05K 1/0203; H05K 2201/066; H05K 7/205; H05K 2201/10393; H05K 7/2039; H05K 7/20418; H05K 7/20427; H05K 7/20445; H05K 7/20454; H05K 7/20463; H05K 7/20472; H05K 7/20481; H05K 7/2049; H05K 7/20509; H05K 7/20518; H05K 7/20854; H05K 7/20863; H05K 7/209; H05K 7/20909; H05K 7/20963; H05K 7/20972; H05K 2201/05; H05K 2201/10681; H05K 1/0277; H05K 1/028; H05K 1/0283; H05K 1/147; H05K 1/189; H05K 2201/051;

(Continued)

(56) References Cited

U.S. PATENT DOCUMENTS 6,498,597 B1   12/2002   Sawano
6,940,497 B2 *  9/2005   Vincent ............... G02F 1/15
                                                        345/204

(Continued)

FOREIGN PATENT DOCUMENTS

JP     2000-132122 A    5/2000
KR  10-2007-0092597 A   9/2007
(Continued)

*Primary Examiner* — Pete Lee
(74) *Attorney, Agent, or Firm* — Lewis Roca Rothgerber Christie LLP

(57) ABSTRACT

A display device including: a flexible display panel; a first housing having an outer peripheral surface around which the flexible display panel is rolled; a jig in the first housing and connected to a first end of the flexible display panel, wherein the flexible display panel is configured to be rolled around the jig; and a second housing accommodating the first housing, wherein the jig and the first housing are configured to be rotated in different directions.

13 Claims, 14 Drawing Sheets

(58) Field of Classification Search
CPC ....... H05K 2201/052; H05K 2201/053; H05K 2201/055; H05K 2201/056; H05K 2201/057; H05K 2201/058; H05K 1/118; H05K 1/148; H05K 3/4691; H01L 23/40; H01L 23/4006; H04M 1/021; H04M 1/0227
See application file for complete search history.

(56) References Cited

U.S. PATENT DOCUMENTS

| | | | | |
|---|---|---|---|---|
| 7,639,237 | B2* | 12/2009 | Perkins | G06F 1/1615 |
| | | | | 345/156 |
| 8,199,471 | B2* | 6/2012 | Bemelmans | G09F 9/00 |
| | | | | 345/690 |
| 8,531,758 | B2* | 9/2013 | van Lieshout | G02F 1/133305 |
| | | | | 359/296 |
| 2007/0216639 | A1 | 9/2007 | LaFarre et al. | |
| 2007/0241002 | A1* | 10/2007 | Wu | G06F 1/1601 |
| | | | | 206/150 |
| 2012/0008267 | A1* | 1/2012 | Watanabe | G02F 1/133305 |
| | | | | 361/679.01 |

FOREIGN PATENT DOCUMENTS

| | | |
|---|---|---|
| KR | 10-0818170 B1 | 4/2008 |
| KR | 10-2014-0101124 A | 8/2014 |

* cited by examiner

DISPLAY DEVICE

CROSS-REFERENCE TO RELATED APPLICATION

This application claims priority to and the benefit of Korean Patent Application No. 10-2015-0061132, filed on Apr. 30, 2015, with the Korean Intellectual Property Office (KIPO), the disclosure of which is incorporated herein in its entirety by reference.

BACKGROUND

1. Field

Embodiments of the present invention relate to a display device, and more particularly, to a rollable display device.

2. Description of the Related Art

Rollable displays are a type of display device which includes a flexible display panel that can be rolled to be accommodated within a housing and unrolled to be used as necessary. Due to the increase in portability and the decrease in storage size of rollable displays, they are garnering attention as next generation display devices.

However, because the flexible display panel continuously receives stress only in one direction within the housing, the flexible display panel may be deformed when kept for a long period of time therein. Accordingly, when the flexible display panel is unrolled, maintaining a flat state thereof may be difficult.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of the subject matter disclosed herein.

SUMMARY

Aspects of embodiments of the present invention are directed to a rollable display device capable of maintaining a flat state of a flexible display panel in an unrolled configuration by preventing stress from being continuously applied thereto only in one direction within a housing.

According to an exemplary embodiment of the present invention, a display device includes: a flexible display panel; a first housing having an outer peripheral surface around which the flexible display panel is rolled; a jig in the first housing and connected to a first end of the flexible display panel, wherein the flexible display panel is configured to be rolled around the jig; and a second housing accommodating the first housing, wherein the jig and the first housing are configured to be rotated in different directions.

The first housing may include a protruding portion having a circular, an elliptical, or a semi-circular cross-sectional shape.

The display device may further include a protective member on the protruding portion of the first housing.

The protective member may include one or more of the following: polycarbonate (PC), polyethyleneterephthalate (PET), polypropylene terephthalate (PPT), polyethylene naphthalate (PEN), cyclic olefin polymer (COP), cyclic olefin copolymer (COC), poly(methyl methacrylate) (PMMA), polyimide (PI), polyacrylate (PAR), polyethersulphone (PES), polyetherimide (PEI), a silicon resin, a fluorocarbon resin, and/or a modified epoxy resin.

The jig may be rotated using one of a motor or a torsion spring.

The first housing may be rotated using one of a motor or a torsion spring.

The display device may further include a wire connecting the flexible display panel and the jig.

The wire may include one or more of the following: a leaf spring, a spiral spring, and a coil spring.

The display device may further include: a first gear on an outer peripheral surface of the jig; a second gear on an inner peripheral surface of the first housing; and a driving gear between the first gear and the second gear, the driving gear being configured to provide a rotational force to the first gear and the second gear.

The driving gear may be rotated using one of a motor or a torsion spring.

The jig may be rotatably fixed to an interior of the first housing.

The first housing may be rotatably fixed to an interior of the second housing.

The first housing may have a first inlet through which the flexible display panel is drawn in or out.

The second housing may have a second inlet through which the flexible display panel is drawn in or out.

The display may further include a handle connected to a second end of the flexible display panel.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
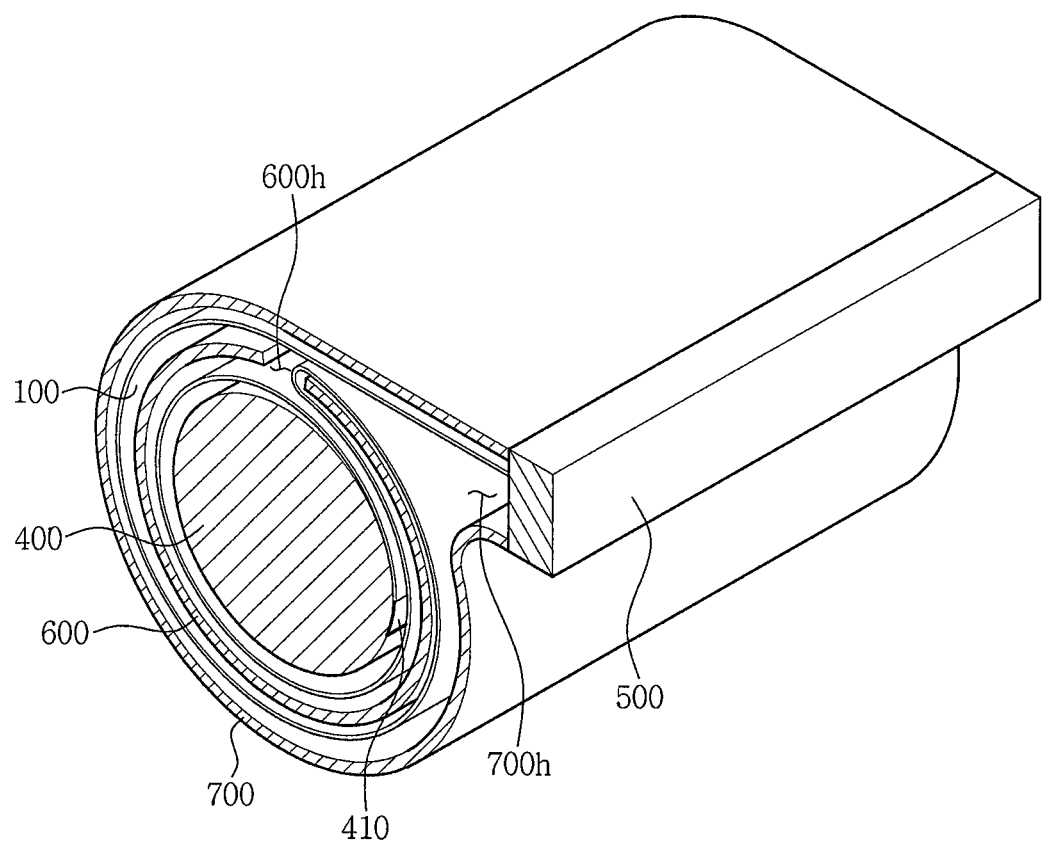
FIG. 1 is a schematic perspective view of a cross-section illustrating a flexible display panel rollably accommodated in a display device according to an exemplary embodiment.

Exemplary embodiments will now be described more fully hereinafter with reference to the accompanying drawings.

However, the present invention may be embodied in different forms and should not be construed as limited to the exemplary embodiments set forth herein. Rather, these exemplary embodiments are provided so that this disclosure will be thorough and complete, and will fully convey exemplary implementations to those skilled in the art.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent to" another element or layer, there are no intervening elements or layers present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

When it is determined that a detailed description may make the purpose of the present invention unnecessarily ambiguous in the description of the embodiments the present invention, such a detailed description may be omitted. In addition, the same components and corresponding components are given the same reference numeral.

Figure 2:
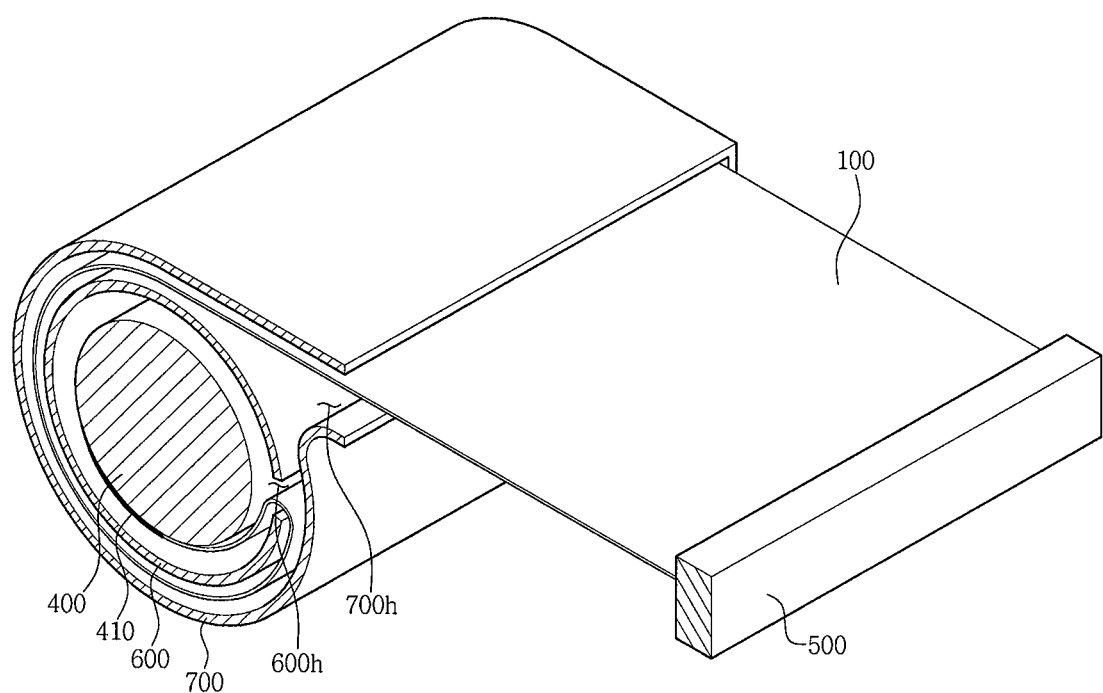
FIG. 2 is a schematic perspective view of a cross-section illustrating a flexible display panel in an unrolled configuration in a display device according to an exemplary embodiment.

FIG. 1 is a schematic perspective view of a cross-section illustrating a flexible display panel 100 rollably accommodated in a display device according to an exemplary embodiment. FIG. 2 is a schematic perspective view of a cross-section illustrating the flexible display panel 100 in an unrolled configuration in the display device according to the exemplary embodiment.

Referring to FIGS. 1 and 2, the display device according to an exemplary embodiment may include the flexible display panel 100, a jig 400 connected to a first end of the flexible display panel 100 and having an outer peripheral surface (e.g., outer circumferential surface) around which the flexible display panel 100 is rolled or unrolled therefrom, a handle 500 connected to a second end of the flexible display panel 100, a first housing 600 accommodating the jig 400 and having an outer peripheral surface around which the flexible display panel 100 is rolled or unrolled therefrom, and a second housing 700 accommodating the first housing 600.

The flexible display panel 100 may be rolled around the outer peripheral surface of the jig 400 in a first direction, and may be rolled around the outer peripheral surface of first housing 600 in a second direction opposite to the first direction. In addition, the flexible display panel 100 may be unrolled from around the outer peripheral surface of the jig 400 in the second direction, and may be unrolled from around the outer peripheral surface of the first housing 600 in the first direction.

The flexible display panel 100 may be an organic light emitting diode ("OLED") display panel or a liquid crystal display ("LCD") panel formed of flexible plastic. A description pertaining to the flexible display panel 100 will be provided in greater detail below.

The flexible display panel 100 may include the first end connected to the jig 400, and the second end connected to the handle 500.

The jig 400 may by actively rotated using a motor, or may be passively rotated using a torsion spring or a wire. For example, the flexible display panel 100 may be connected to the jig 400 through a wire 410. The wire 410 may provide resilience to allow the unrolled flexible display panel 100 to be rolled back around the jig 400. The wire 410 may include at least one of the following: a leaf spring, a spiral spring, and a coil spring.

The handle 500 may be used to provide a pulling force for allowing the rolled flexible display panel 100 to be unrolled outwardly. The handle 500 may be drawn out directly by a hand of a user, or may be automatically drawn out through a motor, or the like.

The first housing 600 may accommodate the jig 400 and a portion of the flexible display panel 100 which is rolled around the jig 400, and may have the outer peripheral surface around which the remainder of the flexible display panel 100 is rolled. In addition, the first housing 600 may have a first inlet 600h through which the flexible display panel 100 is drawn in or out.

Although not illustrated, the jig 400 may be rotatably fixed to the first housing 600. The first housing 600 may have a cylindrical shape. However, the shape of the first housing 600 is not limited thereto, and the first housing 600 may have various suitable shapes.

The first housing 600 may be actively rotated using a motor, or may be passively rotated using a torsion spring or a wire. In the display device according to the exemplary embodiment, the jig 400 and the first housing 600 may be rotated in different directions when the flexible display panel 100 is rolled therearound or unrolled therefrom.

The second housing 700 may accommodate the first housing 600 and the flexible display panel 100 which is rolled around the first housing 600. In addition, the second housing 700 may have a second inlet 700h through which the flexible display panel 100 is drawn in or out.

The handle 500 may be coupled to the second inlet 700h of the second housing 700, such that the flexible display panel 100 is prevented from being entirely rolled into an interior of the second housing 700.

The display device according to an exemplary embodiment may further include a protective film on the flexible display panel 100. The protective film may prevent or substantially prevent a contact between portions of the flexible display panel 100 when the flexible display panel 100 is rolled around or unrolled from the jig 400 and the first housing 600, thereby preventing damage to the flexible display panel 100.

The protective film may include one or more of the following: polycarbonate (PC), polyethyleneterephthalate (PET), polypropylene terephthalate (PPT), polyethylene naphthalate (PEN), cyclic olefin polymer (COP), cyclic olefin copolymer (COC), poly(methyl methacrylate) (PMMA), polyimide (PI), polyacrylate (PAR), polyethersulphone (PES), polyetherimide (PEI), a silicon resin, a fluorocarbon resin, and a modified epoxy resin. In addition, any suitable commonly used protective film material may be employed herein without limitation.

Figure 3:
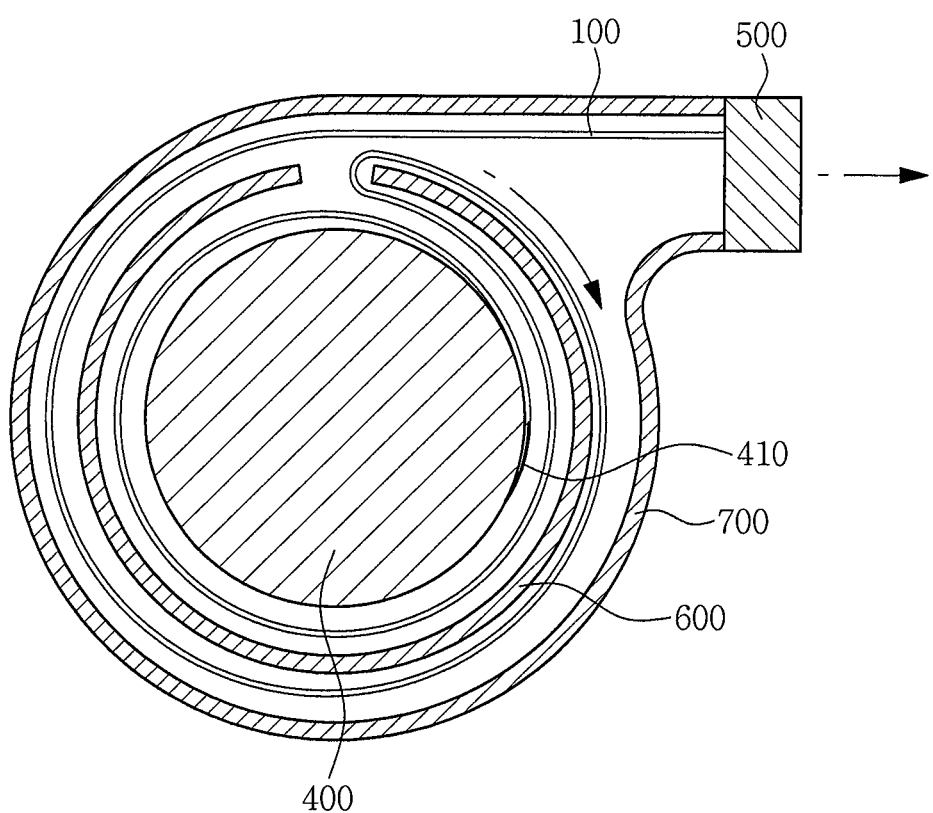
FIGS. 3 and 4 are schematic cross-sectional views illustrating processes of unrolling a flexible display panel in a display device according to an exemplary embodiment.
Figure 4:
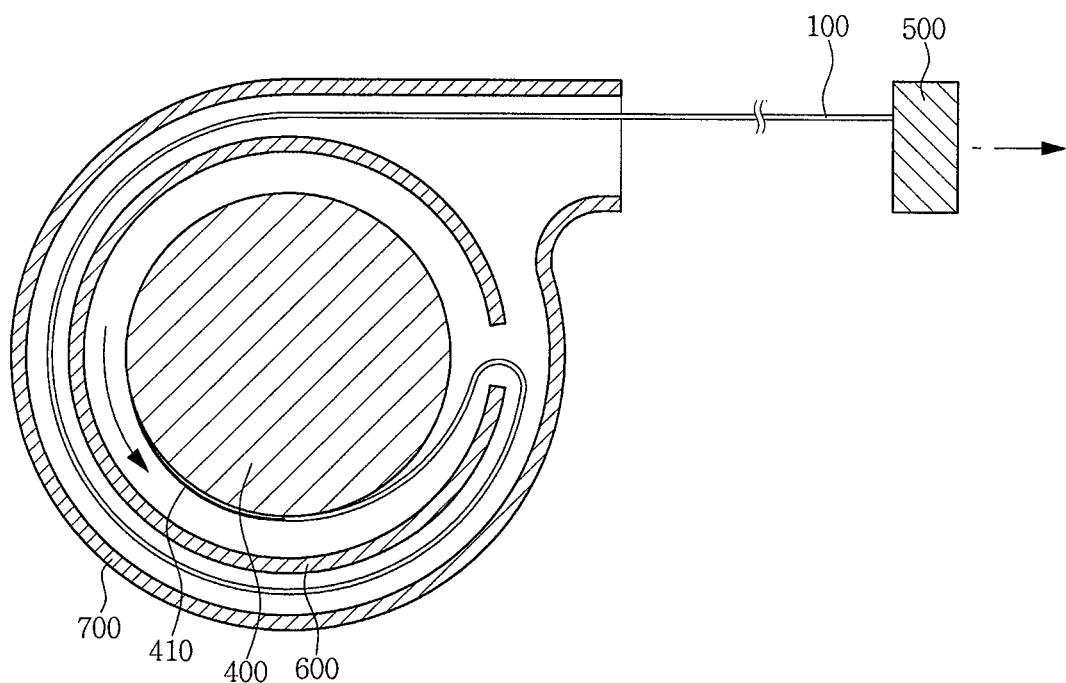

FIGS. 3 and 4 are schematic cross-sectional views illustrating processes of unrolling the flexible display panel 100 in the display device according to the exemplary embodiment.

Referring to FIGS. 3 and 4, when a user pulls the handle 500, the first housing 600 may be rotated in a first direction (for example, a clockwise direction) to thereby allow the flexible display panel 100 to be unrolled.

Subsequently, as the jig 400 is rotated in a second direction (for example, a counterclockwise direction), the flexible display panel 100 may be unrolled. When the flexible display panel 100 is entirely unrolled, the wire 410 may be fully elongated, thereby storing resilience, or elastic potential energy, therein.

According to exemplary embodiments, the flexible display panel 100 which is rolled around the jig 400 and the first housing 600 may be actively unrolled as the jig 400 and the first housing 600 are rotated using a motor or the like.

Figure 5:
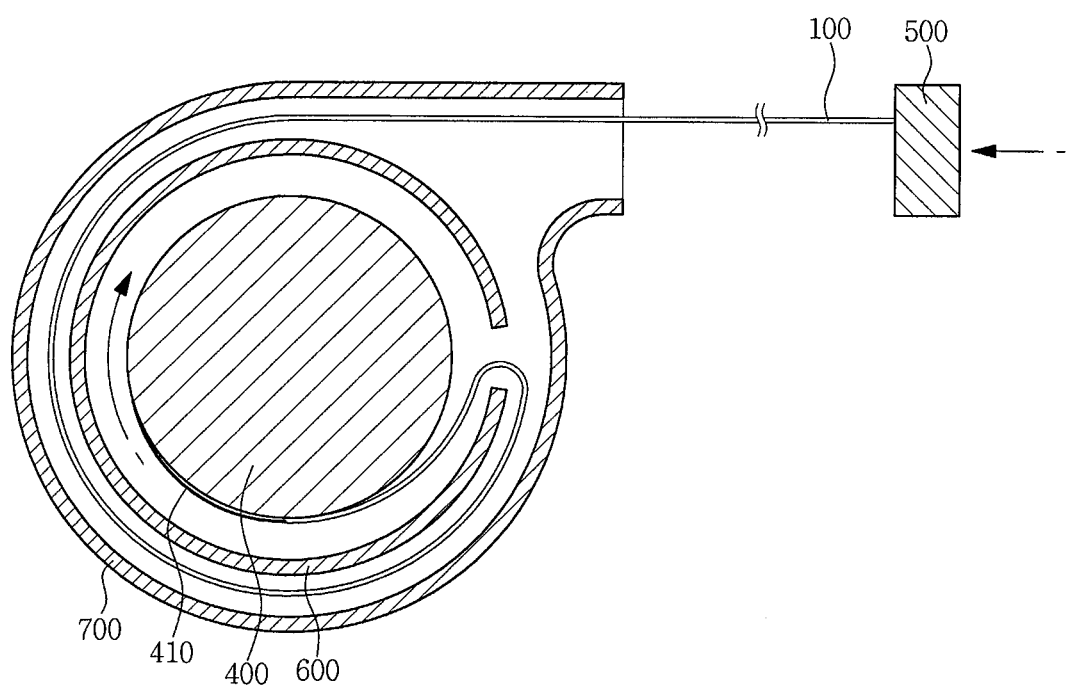
FIGS. 5 and 6 are schematic cross-sectional views illustrating processes of rolling a flexible display panel in a display device according to an exemplary embodiment.
Figure 6:
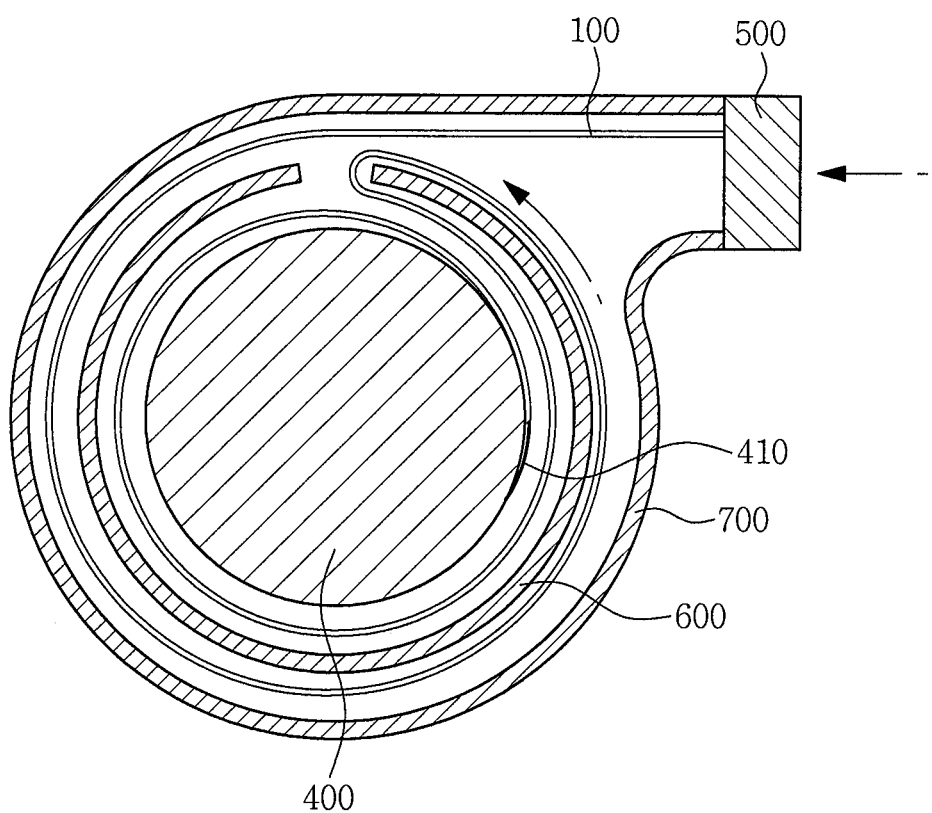

FIGS. 5 and 6 are schematic cross-sectional views illustrating processes of rolling the flexible display panel 100 in the display device according to the exemplary embodiment.

Referring to FIGS. 5 and 6, when a user allows the handle 500 to retract, the jig 400 may be rotated in a first direction (for example, a clockwise direction) due to resilience of the wire 410 to allow the flexible display panel 100 to be rolled around the jig 400.

Subsequently, as the first housing 600 is rotated in a second direction (for example, a counterclockwise direction), the flexible display panel 100 may be rolled around the first housing 600. The first housing 600 may be rotated using a torsion spring, or may be rotated by a rotational force transmitted from the jig 400. A description pertaining thereto will be provided in greater detail below.

In the display device according to the exemplary embodiment, it has been described that the flexible display panel 100 is rolled as the jig 400 is rotated and then the first housing 600 is rotated thereafter. However, the present invention is not limited thereto, and the jig 400 and the first housing 600 may be concurrently rotated to allow the flexible display panel 100 to be rolled therearound.

According to exemplary embodiments, the flexible display panel 100 may be actively rolled as the jig 400 and the first housing 600 are rotated using a motor and/or the like.

Figure 7:
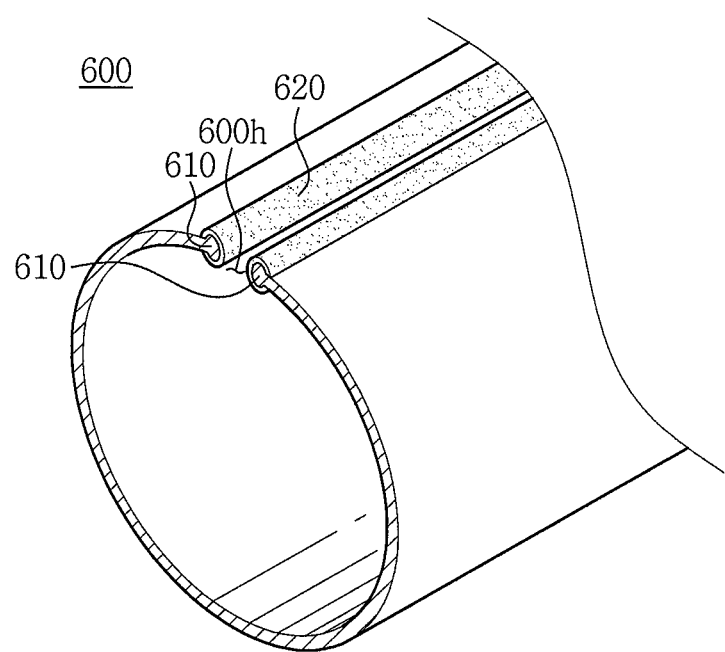
FIG. 7 is a schematic perspective view of a cross-section illustrating an example of a protruding portion of a first housing in a display device according to an exemplary embodiment.
Figure 8:
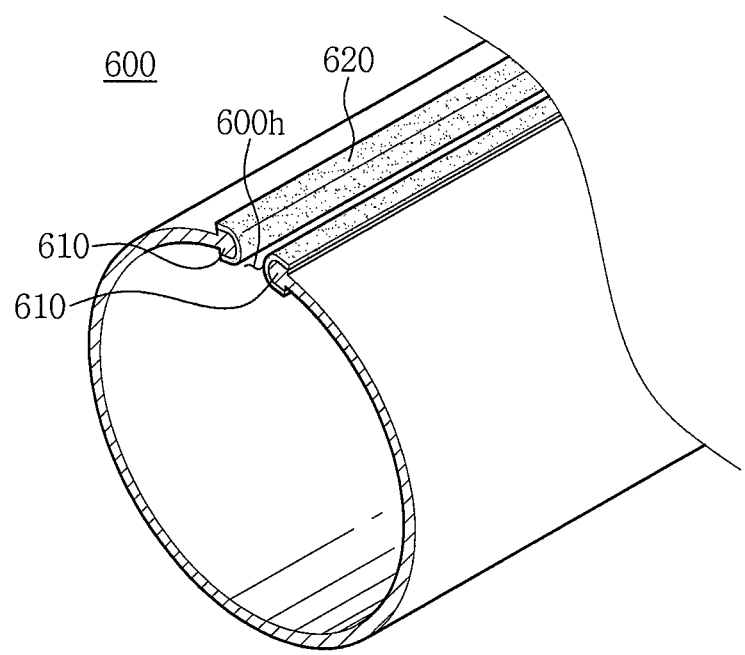
FIG. 8 is a schematic perspective view of a cross-section illustrating another example of a protruding portion of a first housing in a display device according to an exemplary embodiment.

FIG. 7 is a schematic perspective view of a cross-section illustrating an example of a protruding portion 610 of the first housing 600 in the display device according to the exemplary embodiment. FIG. 8 is a schematic perspective view of a cross-section illustrating another example of a protruding portion 610 of the first housing 600 in the display device according to the exemplary embodiment.

Referring to FIGS. 7 and 8, the first housing 600 may have a cylindrical shape having a space therein, and may have the first inlet 600h through which the flexible display panel 100 is drawn in or out. In addition, the first housing 600 may include the protruding portion 610 extended along an edge of the first inlet 600h.

The protruding portion 610 may have one of circular, elliptical (refer to FIG. 7), and semi-circular (refer to FIG. 8) cross-sectional shapes. The first housing 600 may further include a protective member 620 encapsulating the protruding portion 610. The protective member 620 may include one or more of the following: polycarbonate (PC), polyethyleneterephthalate (PET), polypropylene terephthalate (PPT), polyethylene naphthalate (PEN), cyclic olefin polymer (COP), cyclic olefin copolymer (COC), poly(methyl methacrylate) (PMMA), polyimide (PI), polyacrylate (PAR), polyethersulphone (PES), polyetherimide (PEI), a silicon resin, a fluorocarbon resin, and a modified epoxy resin. In addition, a commonly used protective film material may be employed herein without limitation.

The first housing 600 may include the protruding portion 610 formed to have a circular shape along the edge of the first inlet 600h which contacts the flexible display panel 100, the protective member 620 encapsulating the protruding portion 610, and the like, thereby preventing damage to the flexible display panel 100.

Figure 9:
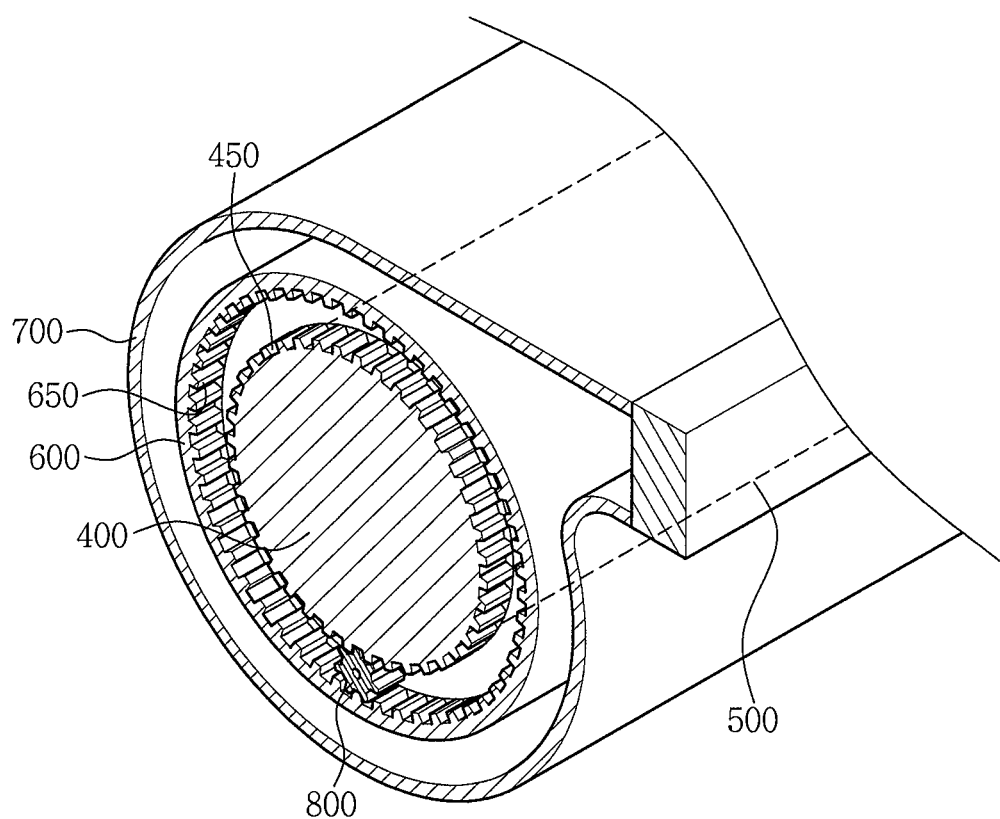
FIG. 9 is a schematic perspective view illustrating a jig and a first housing in a display device according to another exemplary embodiment.
Figure 10:
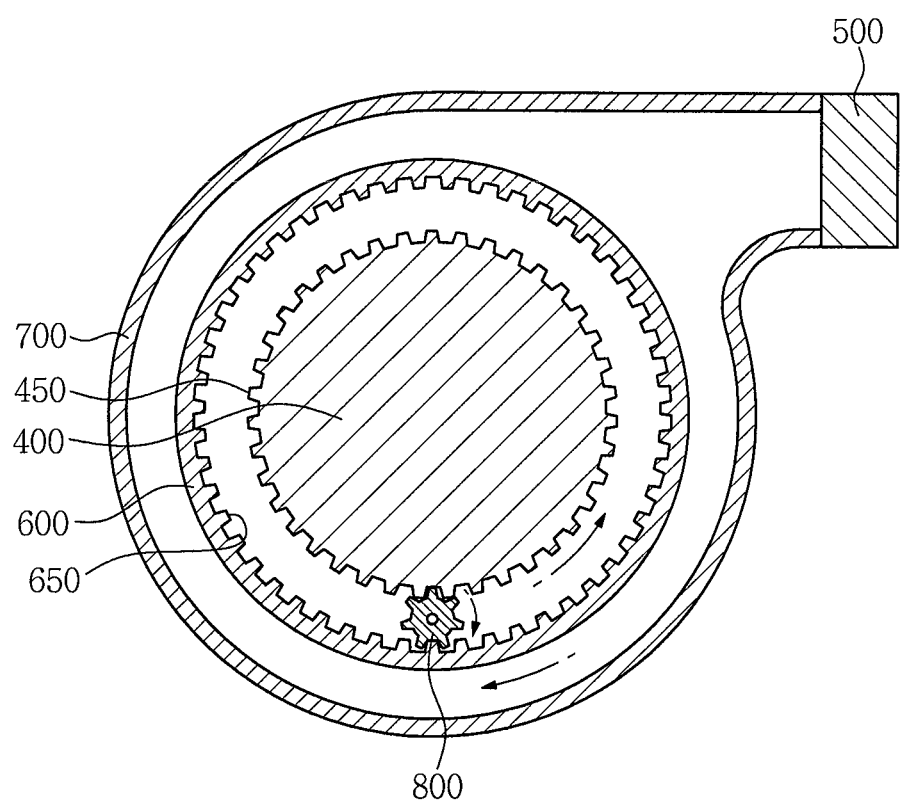
FIG. 10 is a schematic cross-sectional view illustrating a jig and a first housing in a display device according to another exemplary embodiment.

FIG. 9 is a schematic perspective view illustrating a jig 400 and a first housing 600 in a display device according to another exemplary embodiment. FIG. 10 is a schematic cross-sectional view illustrating the jig 400 and the first housing 600 in the display device according to the another exemplary embodiment.

Referring to FIGS. 9 and 10, the display device according to the another exemplary embodiment may include the jig 400 including a first gear 450 formed around a first end of an outer peripheral surface thereof, the first housing 600 including a second gear 650 formed around a first end of an inner peripheral surface thereof, and a driving gear 800 between the first gear 450 and the second gear 650, the driving gear 800 providing a rotational force to the first gear 450 and the second gear 650.

The driving gear 800 may provide a rotational force through a motor, a torsion spring, and/or the like. For example, when the driving gear 800 is rotated in a first direction (for example, a clockwise direction) through a motor, the first gear 450 may be rotated in a second direction (for example, a counterclockwise direction) opposite to the first direction and the second gear 650 may be rotated in the first direction by the rotation of the driving gear 800. According to embodiments, the first direction may refer to a counterclockwise direction, and the second direction may refer to a clockwise direction. As such, the jig 400 and the first housing 600 may be rotated in different directions.

The display device according to the exemplary embodiments may reduce or significantly reduce deformation in the flexible display panel 100 by preventing stress from being continuously applied thereto only in one direction as the flexible display panel 100 is rolled or unrolled in different directions due to the jig 400 and the first housing 600.

In addition, the display device according to the exemplary embodiments may reduce or significantly reduce damage to the flexible display panel 100 by preventing stress from being continuously applied thereto only in one direction as the flexible display panel 100 is rolled or unrolled in different directions due to the jig 400 and the first housing 600.

Figure 11:
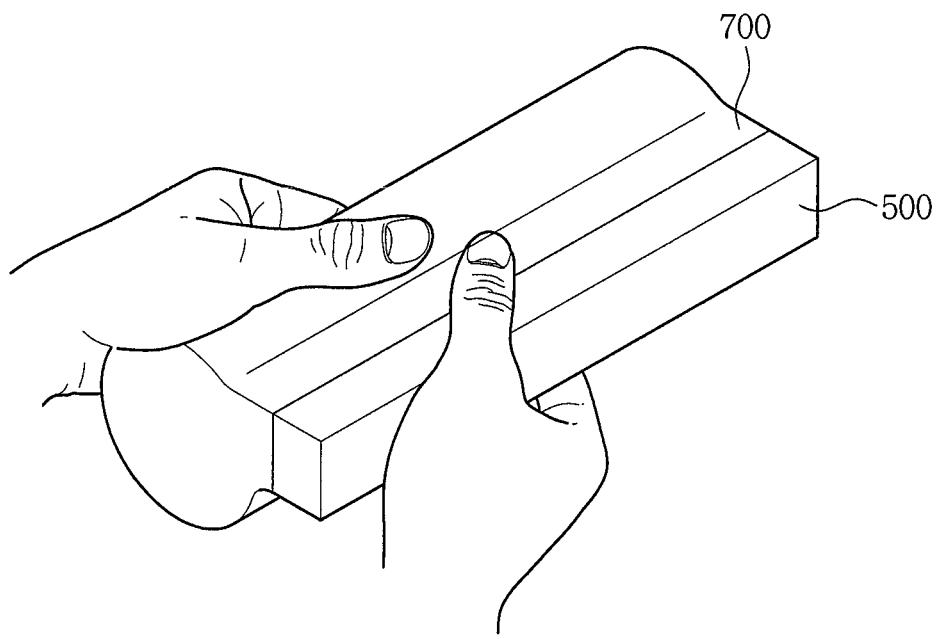
FIGS. 11 and 12 are schematic perspective views illustrating processes of unrolling a flexible display panel in a display device according to an exemplary embodiment.
Figure 12:
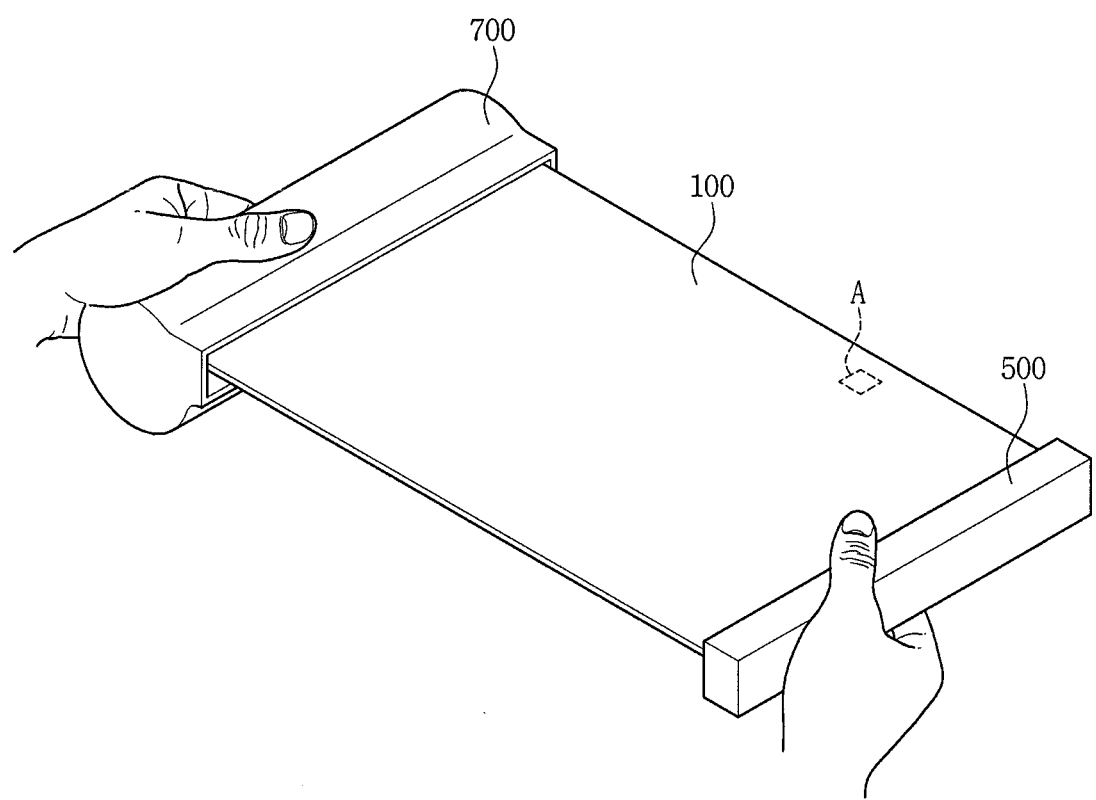
Figure 13:
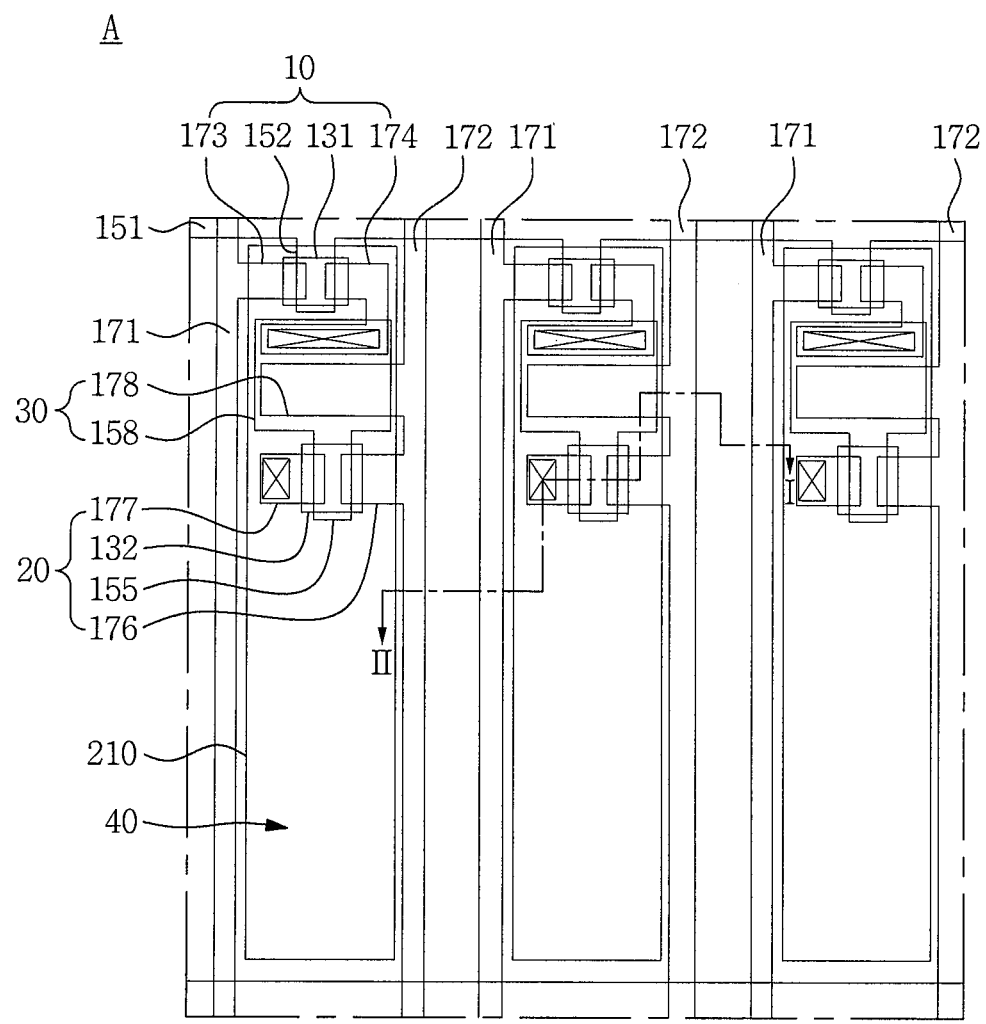
FIG. 13 is an enlarged view illustrating portion "A" of FIG. 12.
Figure 14:
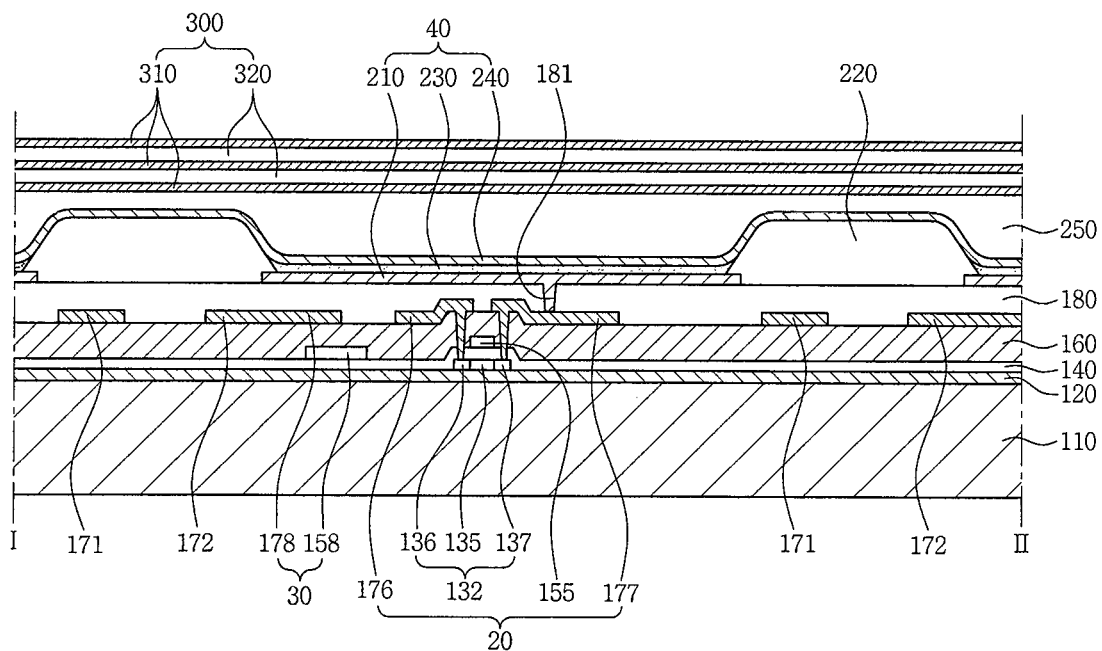
FIG. 14 is a cross-sectional view taken along the line I-II of FIG. 13.

FIGS. 11 and 12 are schematic perspective views illustrating processes of unrolling the flexible display panel 100 in the display device according to the exemplary embodiment. FIG. 13 is an enlarged view illustrating portion "A" of FIG. 12. FIG. 14 is a cross-sectional view taken along line I-II of FIG. 13.

Referring to FIGS. 11-14, the flexible display panel 100 according to an exemplary embodiment may include a switching thin film transistor 10, a driving thin film transistor 20, a capacitor 30, and an organic light emitting diode (OLED) 40, which are formed over a flexible substrate 110.

The flexible substrate 110 may be formed of one or more of the following: Kapton, polyethersulphone (PES), polycarbonate (PC), polyimide (PI), polyethyleneterephthalate (PET), polyethylenenaphthalate (PEN), polyacrylate (PAR), and fiber reinforced plastic (FRP). In particular, polyimide (PI), having high thermal resistivity, may be suitable for forming the flexible substrate 110, which may be subject to high-temperature processes.

The flexible substrate 110 may have a thickness of about 5 micrometers (μm) to about 200 μm. When the flexible substrate 110 has a thickness that is less than about 5 μm, for example, the flexible substrate 110 may not be able to stably support a driving circuit and a display element formed thereon. On the other hand, when the flexible substrate 110 has a thickness that is greater than or equal to about 200 μm, for example, the flexibility thereof may be reduced. In addition, the flexible substrate 110 may have a coefficient of expansion (CTE) of about 3 parts per million (ppm)/° C. to about 10 ppm/° C.

A buffer layer 120 may be formed on the flexible substrate 110. The buffer layer 120 may prevent or substantially prevent the infiltration of impure elements (or components) into the flexible substrate 110 and may planarize a surface of the flexible substrate 110. The buffer layer 120 may be formed of various suitable materials that can perform the aforementioned functions. For example, the buffer layer 120 may be formed of one or more of the following: silicon nitride ($SiN_x$), silicon oxide ($SiO_2$), and silicon oxynitride ($SiO_xN_y$). The buffer layer 120 is not necessarily required, and thus may be omitted based on the type, the process conditions, and the like, of the flexible substrate 110.

A switching semiconductor layer 131 and a driving semiconductor layer 132 may be formed on the buffer layer 120. The switching semiconductor layer 131 and the driving semiconductor layer 132 may be formed of one or more of the following: a polycrystalline silicon layer, an amorphous silicon layer, an oxide semiconductor such as indium-gallium-zinc oxide (IGZO) and indium-zinc-tin oxide (IZTO). For example, when the driving semiconductor layer 132 illustrated in FIG. 14 is formed of a polycrystalline silicon layer, the driving semiconductor layer 132 may include a channel region 135 that is not doped with impurities and a source region 136 and a drain region 137 that are respectively doped with p-type materials on both sides of the channel region 135. The ions used for doping may be p-type impurities such as boron (B), and in particular, diborane ($B_2H_6$) may be used. Such impurities may vary based on the type of the thin film transistor. Although a p-type metal-oxide semiconductor (PMOS) thin film transistor using p-type impurities is described as being used as the driving thin film transistor 20 in the exemplary embodiment, the type of the driving thin film transistor 20 is not limited thereto. Accordingly, the driving thin film transistor 20 may also use one of an n-type metal-oxide semiconductor (NMOS) thin film transistor and a complementary metal-oxide semiconductor (CMOS) thin film transistor.

The switching semiconductor layer 131 and the driving semiconductor layer 132 may include a gate insulating layer 140 formed thereon. The gate insulating layer 140 may be formed of one or more of the following: tetraethyl orthosilicate (TEOS), silicon nitride ($SiN_x$), and silicon oxide ($SiO_2$). For example, the gate insulating layer 140 may have a double-layer structure in which a $SiN_x$ layer having a thickness of about 40 nanometers (nm) and a TEOS layer having a thickness of about 80 nm are sequentially stacked.

A gate wiring may be formed on the gate insulating layer 140, the gate wiring including gate electrodes 152 and 155. The gate wiring may further include a gate line 151, a first capacitor plate 158, and/or other suitable wiring(s). The gate electrodes 152 and 155 may be formed to overlap at least respective portions of the switching semiconductor layer 131 and the driving semiconductor layer 132, in particular, the channel region 135. The gate electrodes 152 and 155 may block impurities from being doped in the channel region 135 when the impurities are doped in the source region 136 and the drain region 137 of the switching semiconductor layer 131 and the driving semiconductor layer 132 during the formation of the switching semiconductor layer 131 and the driving semiconductor layer 132.

The gate electrodes 152 and 155 and the first capacitor plate 158 may be formed on the same layer and may be formed of substantially the same metal. The gate electrodes 152 and 155 and the first capacitor plate 158 may be formed of one or more of the following: molybdenum (Mo), chromium (Cr), and tungsten (W).

An insulating interlayer 160 may be disposed on the gate insulating layer 140, the insulating interlayer 160 covering the gate electrodes 152 and 155. The insulating interlayer 160 may be formed of one or more of the following: silicon nitride (SiN$_x$), silicon oxide (SiO$_2$), and/or tetraethyl orthosilicate (TEOS), in a manner similar to that of the gate insulating layer 140. However, the material forming the insulating interlayer 160 is not limited thereto.

A data wiring may be formed on the insulating interlayer 160, the data wiring including source electrodes 173 and 176 and drain electrodes 174 and 177. The data wiring may further include a data line 171, a common power line 172, a second capacitor plate 178, and/or other suitable wiring(s). The source electrodes 173 and 176 may be connected to the source regions 136 of the semiconductor layers 131 and 132, and the drain electrodes 174 and 177 may be connected to the drain regions 137 of the semiconductor layers 131 and 132, through contact holes formed in the gate insulating layer 140 and the insulating interlayer 160.

A planarization layer 180 may be formed to cover the data line 171, the common power line 172, the source electrodes 173 and 176, the drain electrodes 174 and 177, and the second capacitor plate 178, which are formed over the insulating interlayer 160. The planarization layer 180 may remove any step differences, or differences in height, between the elements (or components) formed over the insulating interlayer 160 and may planarize the elements (or components) formed over the insulating interlayer 160 in order to enhance the light emission efficiency of the OLED 40 to be formed over the planarization layer 180. The planarization layer 180 may be formed of one or more of the following: a polyacrylate resin, an epoxy resin, a phenolic resin, a polyamide resin, a polyimide resin, an unsaturated polyester resin, a polyphenylenether resin, a polyphenylenesulfide resin, and benzocyclobutene (BCB).

As such, the switching thin film transistor 10 may include the switching semiconductor layer 131, the gate electrode 152, for example, a switching gate electrode, the source electrode 173, for example, a switching source electrode, and the drain electrode 174, for example, a switching drain electrode. The driving thin film transistor 20 may include the driving semiconductor layer 132, the gate electrode 155, for example, a driving gate electrode, the source electrode 176, for example, a driving source electrode, and the drain electrode 177, for example, a driving drain electrode. The configuration of the switching thin film transistor 10 and the driving thin film transistor 20 is not limited to the aforementioned description, and may be modified in various suitable manners to include the configurations of thin film transistors known in the art and easily applicable by those skilled in the art. In addition, the capacitor 30 may include the first capacitor plate 158, the second capacitor plate 178, and the insulating interlayer 160 interposed between the first capacitor plate 158 and the second capacitor plate 178.

The insulating interlayer 160 may be a dielectric material, and capacitance of the capacitor 30 may be determined by the amount of electric charge accumulated in the capacitor 30 and the voltage formed across the first and second capacitor plates 158 and 178.

The switching thin film transistor 10 may be used as a switching element for selecting a pixel to emit light. The switching gate electrode 152 may be connected to the gate line 151. The switching source electrode 173 may be connected to the data line 171. The switching drain electrode 174 may be spaced apart from the switching source electrode 173 and may be connected to the first capacitor plate 158.

The driving thin film transistor 20 may apply a driving power to a pixel electrode 210 of the OLED 40, which drives the OLED 40 within the selected pixel to emit light. The driving gate electrode 155 may be connected to the first capacitor plate 158. The driving source electrode 176 and the second capacitor plate 178 may be connected to the common power line 172. The driving drain electrode 177 may be connected to the pixel electrode 210 of the OLED 40 through a contact hole.

Due to the configuration of the thin film transistors as described above, the switching thin film transistor 10 may be operated by a gate voltage applied to the gate line 151 to thereby transfer a data voltage applied to the data line 171 to the driving thin film transistor 20. A voltage that is substantially equal to the difference between the level of a common voltage applied from the common power line 172 to the driving thin film transistor 20 and the data voltage transferred from the switching thin film transistor 10 may be stored in the capacitor 30. A current based on the voltage stored in the capacitor 30 may flow into the OLED 40 through the driving thin film transistor 20 such that the OLED 40 may emit light.

The OLED 40 may include the pixel electrode 210, a light emitting layer 230 formed over the pixel electrode 210, and a common electrode 240 formed over the light emitting layer 230. At least one pixel electrode 210 may be formed in each pixel region.

The pixel electrode 210 of the OLED 40 may be formed over the planarization layer 180. The pixel electrode 210 may be connected to the drain electrode 177 through a contact hole 181 formed in the planarization layer 180.

A pixel defining layer 220 defining the pixel region by exposing at least a portion of the pixel electrode 210 may be formed over the planarization layer 180. The pixel defining layer 220 may be formed of a resin such as a polyacrylate resin or a polyimide resin.

The light emitting layer 230 may be formed over the pixel electrode 210 within the pixel region, and the common electrode 240 may be formed over the pixel defining layer 220 and the light emitting layer 230. The light emitting layer 230 may be formed of a low molecular weight organic material and/or a polymer organic material. At least one of a hole injection layer (HIL) and a hole transporting layer (HTL) may further be interposed between the pixel electrode 210 and the light emitting layer 230, and at least one of an electron transporting layer (ETL) and an electron injection layer (EIL) may further be interposed between the light emitting layer 230 and the common electrode 240.

The pixel electrode 210 and the common electrode 240 may be formed using one of a transmissive electrode, a transflective electrode, and a reflective electrode.

The transmissive electrode may be formed of transparent conductive oxide (TCO). Such transparent conductive oxide (TCO) may be formed of one or more of the following: indium-tin oxide (ITO), indium-zinc oxide (IZO), antimony-tin oxide (ATO), aluminum-zinc oxide (AZO), zinc oxide (ZnO), and/or a compound thereof.

The transflective electrode and the reflective electrode may be formed of a metal such as magnesium (Mg), silver (Ag), gold (Au), calcium (Ca), lithium (Li), chromium (Cr), aluminum (Al), or copper (Cu), and/or an alloy thereof. In this instance, the type of electrode, that is, whether the transflective electrode or the reflective electrode, may be determined based on the thickness thereof. In general, the transflective electrode may have a thickness of about 200 nm or less and the reflective electrode may have a thickness of about 300 nm or greater. As the thickness of the transflective electrode decreases, the light transmittance thereof increases while the resistance thereof also increases. Further, as the thickness of the transflective electrode increases, the light transmittance thereof decreases.

In addition, the transflective and reflective electrodes may have a multilayer structure including a metal layer formed of a metal or a metal alloy and a transparent conductive oxide (TCO) layer stacked on the metal layer.

A capping layer 250 may be formed over the common electrode 240 in order to protect the OLED 40 prior to forming a thin film encapsulation layer 300 and prevent or substantially prevent damage to the OLED 40 during the formation of the thin film encapsulation layer 300. The capping layer 250 may be formed of a single layer or two or more layers and may function as a moisture or oxygen barrier. Alternatively, the capping layer 250 may be omitted and an organic layer 320 of the thin film encapsulation layer 300 may be formed in lieu of the capping layer 250.

The thin film encapsulation layer 300 may be formed on the capping layer 250. The thin film encapsulation layer 300 may include at least an inorganic layer 310 and at least an organic layer 320. In addition, the thin film encapsulation layer 300 may have a structure in which the inorganic layer 310 and the organic layer 320 are alternately stacked. In some embodiments, one of the inorganic layers 310 may be formed as the lowest layer of the thin film encapsulation layer 300. The thin film encapsulation layer 300 may have a thickness of about 10 µm or less. The number of the inorganic layers 310 and the organic layers 320 is not limited to the example illustrated in FIG. 14.

The inorganic layer 310 may include one or more of the following: aluminum oxide and silicon oxide. The organic layer 320 may include one or more of the following: epoxy, acrylate, and urethane acrylate. The inorganic layer 310 may suppress the infiltration of moisture and oxygen toward the flexible display panel 100, and the organic layer 320 may alleviate stress within the inorganic layer 310 and may fill minute cracks, pin holes, and the like, formed in the inorganic layer 310.

A touch screen panel may further be provided on the thin film encapsulation layer 300. The touch screen panel may detect the presence and position of a touch input. For example, a user may use the touch screen panel via a stylus pen, a finger, or the like. The touch screen panel may be formed of a transparent material.

As set forth above, according to one or more exemplary embodiments, the display device may reduce or significantly reduce deformation in the flexible display panel by preventing stress from being continuously applied thereto only in one direction within the housing.

In addition, the display device may reduce or significantly reduce damage to the flexible display panel by preventing stress from being continuously applied thereto only in one direction within the housing.

From the foregoing, it will be appreciated that various embodiments in accordance with the present disclosure have been described herein for purposes of illustration, and that various suitable modifications may be made without departing from the scope and spirit of the present invention. Accordingly, the various embodiments disclosed herein are not intended to be limiting of the true scope and spirit of the present invention. Various features of the above described and other embodiments can be mixed and matched in any manner, to produce further embodiments consistent with the invention. Thus, the present embodiments of the invention should be considered in all respects as illustrative and not restrictive, the scope of the invention to be indicated by the appended claims and their equivalents.

What is claimed is:

1. A display device comprising: a flexible display panel; a first housing having an outer peripheral surface around which the flexible display panel is rolled; a jig in the first housing and connected to a first end of the flexible display panel, wherein the flexible display panel is configured to be rolled inside the first housing around the jig; and a second housing accommodating the first housing, wherein the jig and the first housing are configured to be rotated in different directions, and wherein a rotating direction of a first portion of the flexible display panel in the first housing is opposite to a rotating direction of a second portion of the flexible display panel in the second housing when the flexible display panel is drawn out or retracted in.

2. The display device of claim 1,
wherein the first housing comprises a protruding portion having a circular, an elliptical, or a semi-circular cross-sectional shape.

3. The display device of claim 2, further comprising:
a protective member on the protruding portion of the first housing.

4. The display device of claim 3,
wherein the protective member comprises one or more of the following: polycarbonate (PC), polyethylene-terephthalate (PET), polypropylene terephthalate (PPT), polyethylene naphthalate (PEN), cyclic olefin polymer (COP), cyclic olefin copolymer (COC), poly(methyl methacrylate) (PMMA), polyimide (PI), polyacrylate (PAR), polyethersulphone (PES), polyetherimide (PEI), a silicon resin, a fluorocarbon resin, and a modified epoxy resin.

5. The display device of claim 1,
wherein the jig is configured to be rotated using a motor or a torsion spring.

6. The display device of claim 1,
wherein the first housing is configured to be rotated using a motor or a torsion spring.

7. The display device of claim 1, further comprising:
a wire connecting the flexible display panel and the jig.

8. The display device of claim 7,
wherein the wire comprises one or more of the following: a leaf spring, a spiral spring, and a coil spring.

9. The display device of claim 1,
wherein the jig is rotatably fixed to an interior of the first housing.

10. The display device of claim 1,
wherein the first housing is rotatably fixed to an interior of the second housing.

11. The display device of claim 1,
wherein the first housing has a first inlet through which the flexible display panel is drawn in or out.

12. The display device of claim 1,
wherein the second housing has a second inlet through which the flexible display panel is drawn in or out.

13. The display device of claim 1, further comprising:
a handle connected to a second end of the flexible display panel.

* * * * *